(12) United States Patent
Kowalski et al.

(10) Patent No.: US 6,319,827 B1
(45) Date of Patent: Nov. 20, 2001

(54) INTEGRATED ELECTRONIC MICROMODULE AND METHOD FOR MAKING SAME

(75) Inventors: Jacek Kowalski, Aix en Provence; Didier Serra, Septèmes les Vallons; Frédéric Bertholio, Puyricard, all of (FR)

(73) Assignee: Inside Technologies, Saint Clement les Places (FR)

( * ) Notice: Subject to any disclaimer, the term of this patent is extended or adjusted under 35 U.S.C. 154(b) by 0 days.

(21) Appl. No.: 09/720,701

(22) PCT Filed: Jun. 14, 1999

(86) PCT No.: PCT/FR99/01405
§ 371 Date: Mar. 1, 2001
§ 102(e) Date: Mar. 1, 2001

(87) PCT Pub. No.: WO00/01013
PCT Pub. Date: Jan. 6, 2000

(30) Foreign Application Priority Data
Jun. 29, 1998 (FR) .................................................. 98 08426

(51) Int. Cl.$^7$ ..................................................... H01L 21/44
(52) U.S. Cl. ...................... 438/666; 438/113; 438/460; 438/622; 438/624; 257/679; 257/678; 257/692
(58) Field of Search ..................................... 438/113, 460, 438/622, 624, 666; 257/678, 679, 692

(56) References Cited

FOREIGN PATENT DOCUMENTS

| 0782190 | 7/1997 | (EP) | ............................... H01L/23/64 |
| 2300068 | 10/1996 | (GB) | ............................... H01L/23/31 |

OTHER PUBLICATIONS

Patent Abstracts of Japan, vol. 017, No. 672, (E–1474), (Dec. 10, 1993) & JP 05 226506 A (Mitsubishi Materials Corp), (Sep. 3, 1993).
Patent Abstracts of Japan, vol. 095, No. 004, (May 31, 1995) & JP 07 014876 A (Matsushita Electron Corp), (Jan. 17, 1995).
Patent Abstracts of Japan, vol. 095, No. 007, (Aug. 31, 1995) & JP 07 106514 A (Toshiba Corp), (Apr. 21, 1995).

Primary Examiner—John F. Niebling
Assistant Examiner—David A. Zarneke
(74) Attorney, Agent, or Firm—Allen, Dyer, Doppelt, Milbrath & Gilchrist, P.A.

(57) ABSTRACT

An electronic micromodule includes a support wafer, and an integrated circuit chip on the support wafer. The integrated circuit chip includes electrical connector areas, and at least one insulation layer is on the support wafer and the integrated circuit chip. The insulation layer includes openings to the electrical connector areas. At least one flat winding defining a coil is on the insulation layer and is connected to the electrical connector areas. A conducting material is in in each of the openings through the insulation layer for connecting the coil to the electrical zconnector areas.

26 Claims, 7 Drawing Sheets

INTEGRATED ELECTRONIC MICROMODULE AND METHOD FOR MAKING SAME

FIELD OF THE INVENTION

The present invention relates to electronics, and, more particularly, to an electronic micromodule comprising a support wafer, an integrated circuit chip, and at least one flat winding forming an antenna coil.

BACKGROUND OF THE INVENTION

In recent years, contactless integrated circuits have been developed that operate through an antenna coil, including receiving or transmitting data by inductive coupling in the presence of a magnetic field transmitted by a data transmitting and/or receiving station. These integrated circuits, which are also called passive transponders, can be used to produce various contactless electronic portable objects such as smart cards, electronic tags and electronic tokens, for example.

The present invention concerns the production of such portable objects, and, more particularly, the production of the electronic part of such objects. The most frequently used method to produce the electronic part of a contactless portable object includes using a support wafer on which a coil and a silicon chip are arranged. The coil is then connected to the chip and the unit is covered with protective resin. Generally, the support wafer is a printed circuit board. The coil is a copper wire glued on or an etched copper strip. The coil and chip are connected by ultrasonically bonded metal wires. The assembly forms an electronic micromodule designed to be inserted into the body of a portable object (plastic card, token, land, key . . . ) or fixed onto the surface of such an object.

The inconvenience of this method is that it involves the micromodule components being handled at several steps and requires assembling, wiring and controlling steps which increases the cost of micromodules and restrict rates of output. Moreover, with this method it is not possible to produce very thin micromodules.

Generally, the printed circuit board is approximately 150 micrometers thick, the silicon chip is approximately 150 micrometers thick once the rear side has been chemically or mechanically abraded, and the height of the loops formed by the wiring cables is in the region of 120 micrometers. Finally, the thickness of the resin coating the wires is between 20 and 50 micrometers. In total, the thickness of a classic micromodule is in the region of 400 to 500 micrometers. In comparison, the thickness of a plastic card is approximately 760 micrometers. Contactless smart cards that contain this type of micromodule are often uneven.

Several methods are also known by which it is possible to collectively produce a plurality of coils on one silicon wafer comprising a plurality of integrated circuits, such as the method described in U.S. Pat. No. 4,857,893, for example. After cutting the silicon wafer, very thin integrated micromodules are obtained. The handling, assembly and connection phases of chips and coils are thus removed.

However, the surface area provided by a silicon chip, which is a few square millimeters, is insufficient to produce a high inductance coil. Integrated circuits fitted with an integrated coil are therefore reserved for so-called "proximity" applications. This is where the electromagnetic induction communication distance is short, and is on the order of one millimeter.

Moreover, it is also conceivable to produce larger scale coils on a silicon wafer, such as coils surrounding the areas where the integrated circuits are located, for example. However, this approach is inconvenient in that it reduces the number of integrated circuits that can be produced together on a single silicon wafer, and thus increases the cost. In the semiconductor industry, the cost of a silicon chip is determined by the production cost of the silicon wafer divided by the number of chips produced. Thus, for example, the production of 6 $mm^2$ coils on a silicon wafer comprising integrated circuits of a surface area of 2 $mm^2$ increases the cost price of each integrated circuit three-fold.

Finally, the methods that include integrating electronic circuits and coils in one silicon wafer do not seem to be advantageous despite the gain in labor due to the removal of the need to assemble and wire the coils and the integrated circuits. Several technological methods are already known, by which it is possible to produce integrated coils together and at a low cost, particularly the polyimide/silicon dioxide/copper multilayer method on a silicon wafer. Once separated, the coils are in the form of small chips that can be assembled and connected to integrated circuit chips. Nonetheless, the same problems of labor arise due to the need to handle, assemble and connect small individual components two at a time.

SUMMARY OF THE INVENTION

An object of the present invention is to provide a method to manufacture thin micromodules together that comprise an integrated coil and an integrated circuit, without increasing the cost price of integrated circuits and without the need to assemble individual components.

Another object of the present invention is to provide a hybrid micromodule with two operating modes, one conventional operating mode via contact pads and one contactless operating mode via an antenna coil that is small in size and easy to produce.

These and other objects, advantages and features are achieved by a collective manufacturing method for a plurality of electronic micromodules each comprising a support wafer, an integrated circuit chip with electric connector areas, and at least one coil. The method comprises assembling a plurality of integrated circuit chips onto a support wafer; depositing on the surface of the support wafer an electrically insulating layer covering all the chips; making several apertures in the insulating layer opposite the connector areas of the chips; jointly producing on the support wafer a plurality of flat windings forming coils; connecting each coil to a corresponding chip; and cutting out the support wafer to separate the micromodules.

Advantageously, the coils are connected to the chips by depositing a conducting material in the apertures made in the insulating layer. Advantageously, the conducting material deposited in the apertures is the conducting material forming the coils.

According to one embodiment, the coil is produced on several conducting levels separated by insulating layers.

According to another embodiment, the support wafer is made of silicon. The deposit of an insulating layer includes one step of depositing a layer of polyimide and one step of depositing a layer of silicon dioxide. The coils are produced by copper electroplating. According to yet another embodiment, a protective material is deposited on the entire support wafer before cutting the support wafer.

The present invention also concerns an electronic micromodule comprising a support wafer, an integrated circuit chip and at least one flat winding forming a coil. The chip is preferably embedded in at least one electrically insulating layer comprising at least one layer of at least one insulating material, and the coil is arranged on the insulating layer.

According to one embodiment, the coil is preferably connected to the chip through metal apertures passing through the insulating layer to reach the electric connector areas of the chip.

According to another embodiment, the chip is covered with at least two insulating layers, one of the two insulating layers is a support for the winding forming the coil. The other insulating layer is a support for a conductor linking one end of the coil to a connector area of the chip.

According to yet another embodiment, the chip is covered with at least two insulating layers and the coil comprises at least two flat windings arranged respectively on each of the insulating layers.

The present invention also concerns a hybrid micromodule comprising a support wafer with contact pads on its front side, and in which the support wafer has a micromodule according to the present invention on the rear side. The micromodule preferably comprises an integrated circuit chip with two operating modes, with or without contact, and an insulating layer with apertures to connect the chip to the contact pads.

BRIEF DESCRIPTION OF THE DRAWINGS

These objects, characteristics and advantages and other features of the present invention shall be presented in greater detail in the following description of the manufacturing method according to the invention and of various examples of production of micromodules according to the invention, in relation with the following figures.

DETAILED DESCRIPTION OF THE PREFERRED EMBODIMENTS

Generally speaking, the idea of the present invention is to produce coils together on a support on which integrated circuit chips have previously been arranged. The support is different from the silicon wafer used to manufacture the integrated circuits, and the method does not increase the cost of such. The coils are produced by using low-cost technology. Thus, after cutting out the support, integrated micromodules are produced at a low cost.

Figure 1:
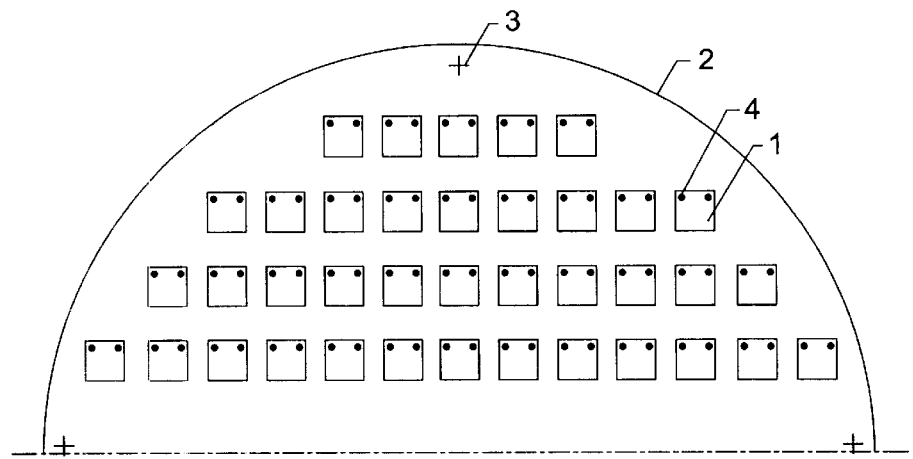
FIGS. 1 and 2 respectively illustrate a top view and a sectional view of a support wafer on which silicon chips are deposited, and illustrates an initial step of the method according to the present invention.
Figure 2:
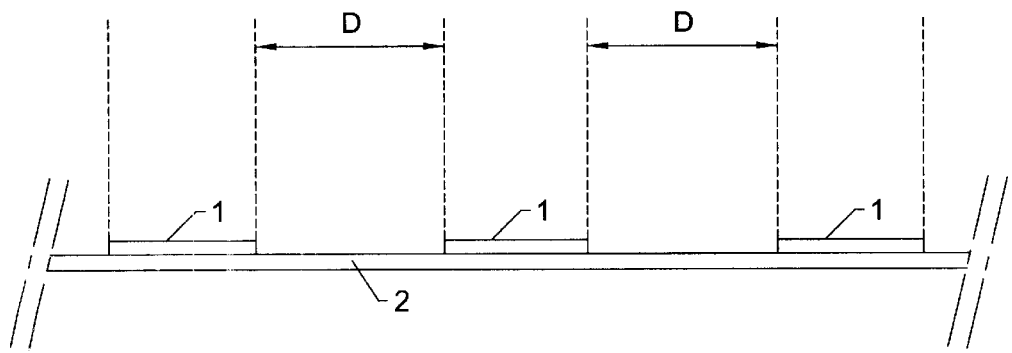

An initial step of the method according to the invention, as shown in FIGS. 1 and 2, includes arranging a plurality of silicon chips 1 on a support wafer 2 that is preferably rigid. The chips are fixed onto the support wafer 2 by any classic method, such as gluing, for example, and are arranged at a predetermined distance D from each other. This step is preferably automated so that the chips are precisely positioned. For that, patterns 3 can be used on the support wafer 2.

The silicon chips 1 are contactless type integrated circuits comprising metal pads 4 to be connected to a coil. The chips are made out of a silicon wafer pared by a classic chemical or mechanical abrasion method. The thickness of the chips may be less than that of chips mounted onto printed circuit boards due to the rigidity of the support wafer 2, and may be on the order of 50 to 150 micrometers.

According to the invention, on the support wafer 2 a plurality of integrated coils are produced to form thin integrated micromodules with the chips 1. An example of implementation of the method according to the invention is described below using polyimide/silicon dioxide/copper technology on a silicon substrate, as used in the prior art to produce integrated coils. Here, the support wafer 2 is a blank silicon wafer of standard thickness in the region of 675 micrometers that will be pared during a final step of the manufacturing method.

Figure 3A:
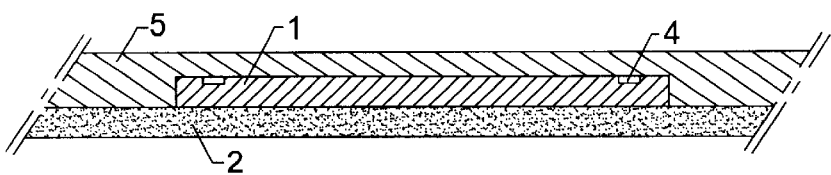
FIGS. 3A to 3D are partial sectional views of the support wafer and illustrate other steps of the method according to the present invention.
Figure 3B:
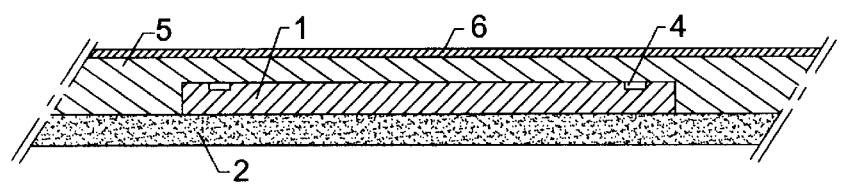
Figure 3C:
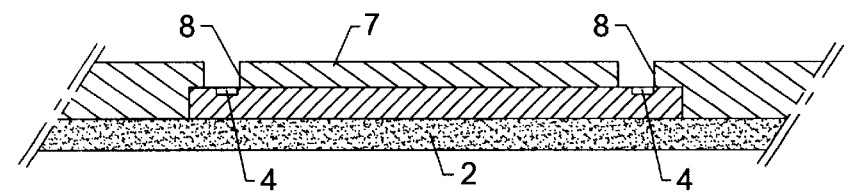

FIGS. 3A to 3C are partial sectional views of the support wafer 2 illustrating various steps of the method according to the invention. The thickness of the various elements is not reproduced to scale so that the diagrams remain legible. During the phase shown in FIG. 3A, the support wafer 2 is coated with a layer 5 of polyimide. In the traditional way, the polyimide is deposited in liquid form, then spread over the wafer 2 by centrifugation and polymerized in a drying oven. Depending on the viscosity of the polyimide, several depositing, centrifugation and polymerization steps may be required to obtain a layer 5 that fully covers the silicon chips 1.

This step is followed by a traditional resurfacing step (planarizing) of the polyimide layer 5, such as by mechanical abrasion, for example. Preferably, the mechanical abrasion is be continued until the thickness of the polyimide layer 5 over the silicon chips 1 is quite low, such as in region of 10 micrometers, for example.

The following step, as shown in FIG. 3B, involves depositing a fine layer of silicon dioxide 6 having a thickness in the region of 5 to 10 micrometers on the resurfaced area 5. The silicon dioxide is deposited using a classic method, such as during a vapor phase using a chemical vapor deposition (CVD) technique, for example.

Out of simplicity, it shall now be considered that the layers of polyimide 5 and silicon dioxide 6 form a single insulating layer 7 in which the chip 1 is embedded. In fact, the cumulated deposit of these two materials is a particular feature of the method used here, as the polyimide allows a thick insulating layer to be produced in a short space of time. The silicon dioxide is used as a support for a layer of copper deposited during a step described below.

During the step shown in FIG. 3C, the insulating layer 7 is perforated to make apertures 8 opposite the metal pads 4 of silicon chips 1. Preferably, apertures 8 are produced by chemically etching the insulating layer 7 using a photosensitive etching resist that has first been insulated and developed. One particular approach to this etching phase includes etching the layer of silicon dioxide 6 first using an etchant that is non-aggressive for the polyimide, with interposition of an etching resist. Then, the etched layer of silicon dioxide is used as an etching resist to etch the layer of polyimide 5 using a second etchant that is non-aggressive for the silicon dioxide.

Figure 3D:
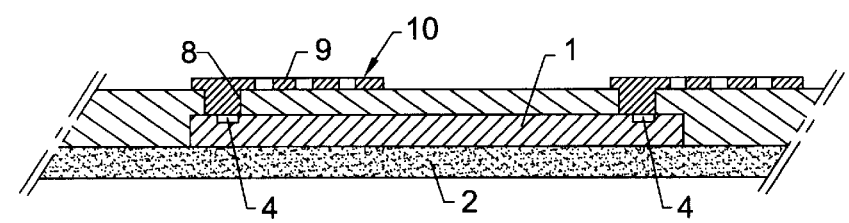

During the phase shown in FIG. 3D, a layer of copper 9 having a thickness of approximately 20 to 50 micrometers is deposited on the insulating layer 7 by electroplating, for example. The layer of copper 9 penetrates into the apertures 8 and adheres to the connector areas 4 of the chip 1. The layer of copper 9 is then etched so that the flat windings in the form of coils 10 appear, with each winding connected to a silicon chip 1.

Figure 4:
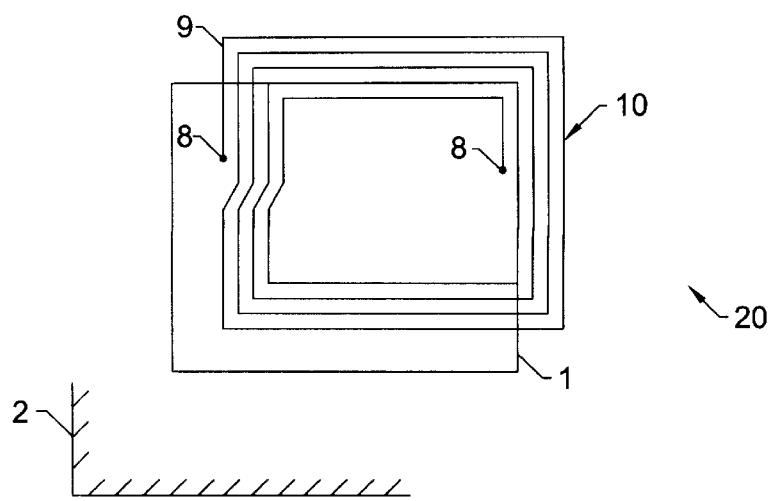
FIG. 4 is a top view of an initial example of the production of micromodules according to the present invention.

FIG. 4 represents an example of a coil 10 produced according to the method of the invention method, wherein an integrated micromodule 20 is illustrated as having an embedded chip 1 therein. Here, the coil 10 overlaps the chip 1 in a considerably offset position allowing the ends of the inner turn and the outer turn to coincide with the connector areas 4 of the chip 1.

Figure 5:
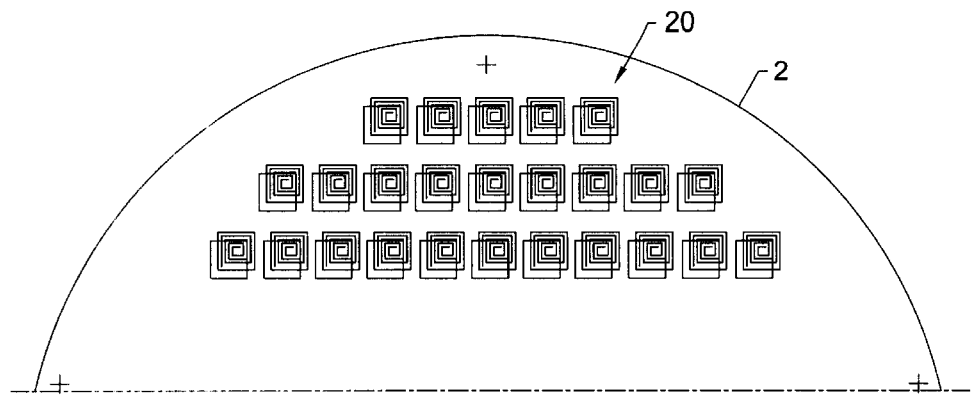
FIG. 5 is a general view of a plurality of micromodules produced together on the support wafer according to the present invention.
Figure 6:
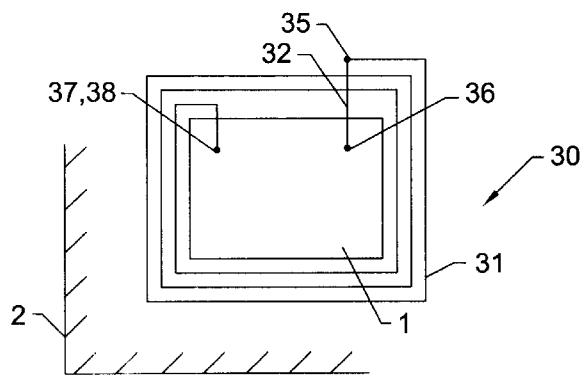
FIGS. 6 and 7 respectively represent a top view and a sectional view of a second example of the production of a micromodule according to the present invention.
Figure 7:
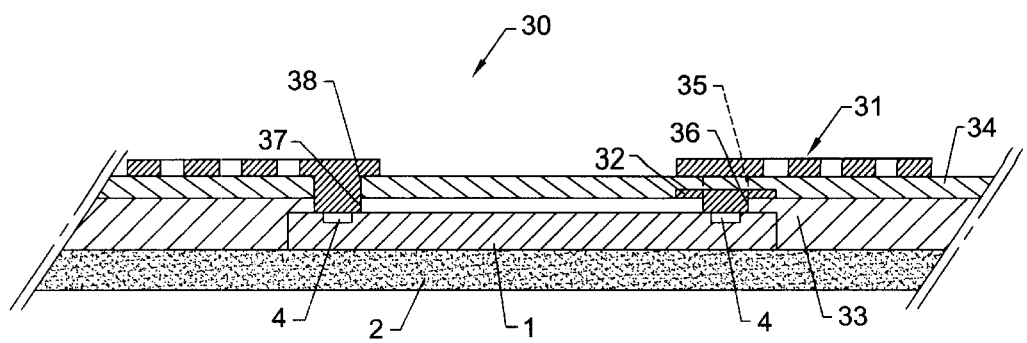

FIG. 5 gives an overall view of the surface of the silicon wafer 2. It shows that a plurality of micromodules 20 have been produced together. Before being cut into separate micromodules, wafer 2 is preferably coated with a layer of protective resin, then pared by abrasion of the rear side until a thickness in the region of 100 micrometers is obtained. At the end, the micromodules according to the invention are approximately 200 to 300 micrometers thick.

Thus, with the method according to the present invention it is possible to produce integrated micromodules that are comparable in terms of size to those produced in the prior art on silicon wafers comprising integrated circuits. However, the surface occupied by the coils, chosen according to the intended application, does not affect the cost of the integrated circuits that are produced here on an independent silicon wafer. As the manufacturing method of the coils is much less expensive than the manufacturing method of the integrated circuits, the cost of micromodules according to the invention does not increase in an unacceptable manner according to the surface area occupied by the coils.

In fact, the production of a micromodule according to the invention only requires, in practice, 2 to 5 etching resists (depending on the embodiment chosen) while the manufacture of an integrated circuit usually requires about twenty etching resists. Moreover, the precision required to produce the coils is only in the region of 1 to 2 micrometers while integrated circuits are currently produced with a precision of less than a micrometer.

Furthermore, the method according to the invention offers extensive possibilities in terms of micromodule design due to the possibility of having several conducting levels. In this case, several levels of copper are separated by insulating layers. In general, several conducting levels can be used to reduce the number of coil windings. A compromise can be achieved between an extension of the number of windings in the plane of the support wafer and an extension of the number of windings over several conducting levels.

To give more detail, FIGS. 6–7 and 8–9 represent two other examples of the production of micromodules according to the invention. The micromodule 30 shown in FIGS. 6 and 7 comprises a coil 31 that is larger than that of the micromodule shown in FIG. 4, and here the coil 31 sur-rounds the silicon chip 1. The outer turn of the coil 31 is connected to one of the metal pads 4 of the silicon chip by a conductor 32 in copper arranged on an initial insulating layer 33, with the coil 31 arranged on a second insulating layer 34.

The conductor 32 is connected to the coil 31 through an aperture 35 made in layer 34 and it is connected to the metal pad 4 through an aperture 36 made in layer 33. Finally, the internal turn of the coil 31 is connected to the other metal pad 4 through two superimposed apertures 37 and 38 made in insulating layers 33 and 34. One embodiment inverts the relative positions of the coil 31 and the conductor 32 on each of the insulating layers.

Figure 8:
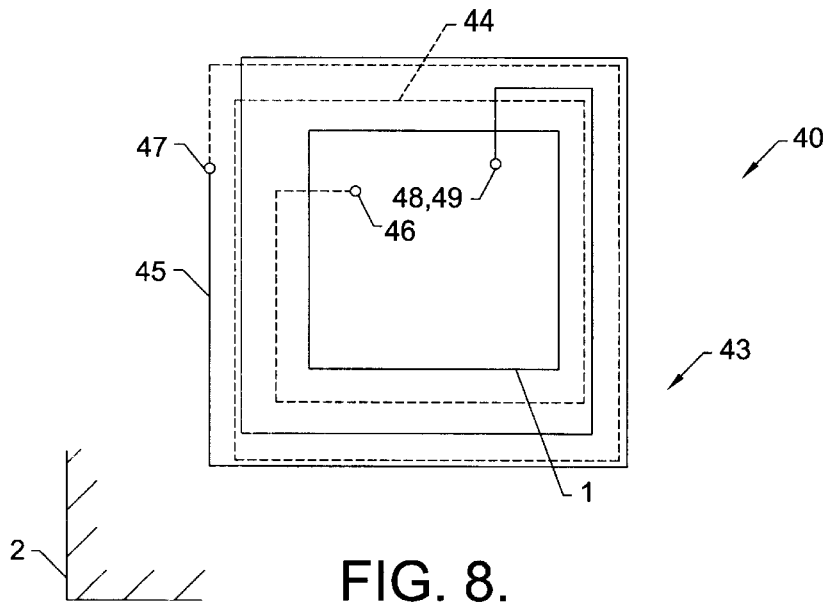
FIGS. 8 and 9 respectively represent a top view and a sectional view of a third example of the production of a micromodule according to the present invention.
Figure 9:
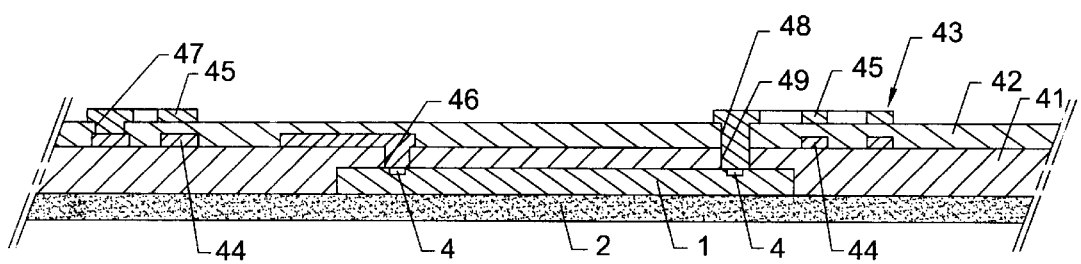

Micromodule 40 represented in FIGS. 8 and 9 comprises two insulating layers 41, 42 and a coil 43 with two flat windings 44, 45 that are superimposed and connected in series. The first winding 44, represented by a dotted line in FIG. 8, is deposited on the insulating layer 41. One of its ends is connected to a metal pad 4 of the chip 1 through an aperture 46 made in the first insulating layer 41. The other end of the winding 44 is connected to one end of the second winding 45 through an aperture 47 made in the second insulating layer 42. Finally, the other end of winding 45 is connected to the other metal pad 4 of the chip 1 through two superimposed apertures 48, 49 made in the two insulating layers 41, 42.

Figure 10A:
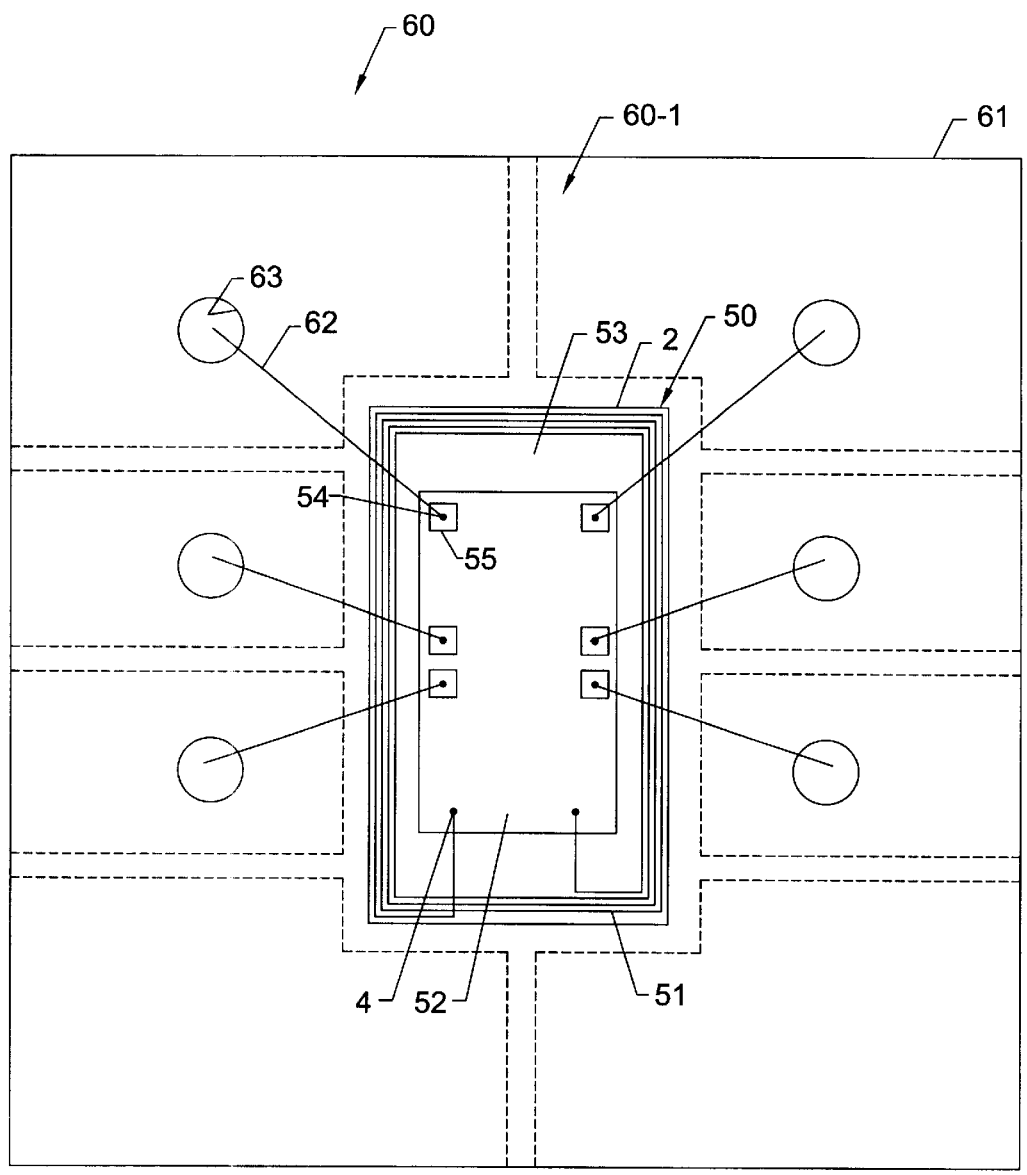
FIGS. 10A and 10B respectively represent a bottom view and a top view of a hybrid micromodule comprising a micromodule and contact pads according to the present invention.
Figure 10B:
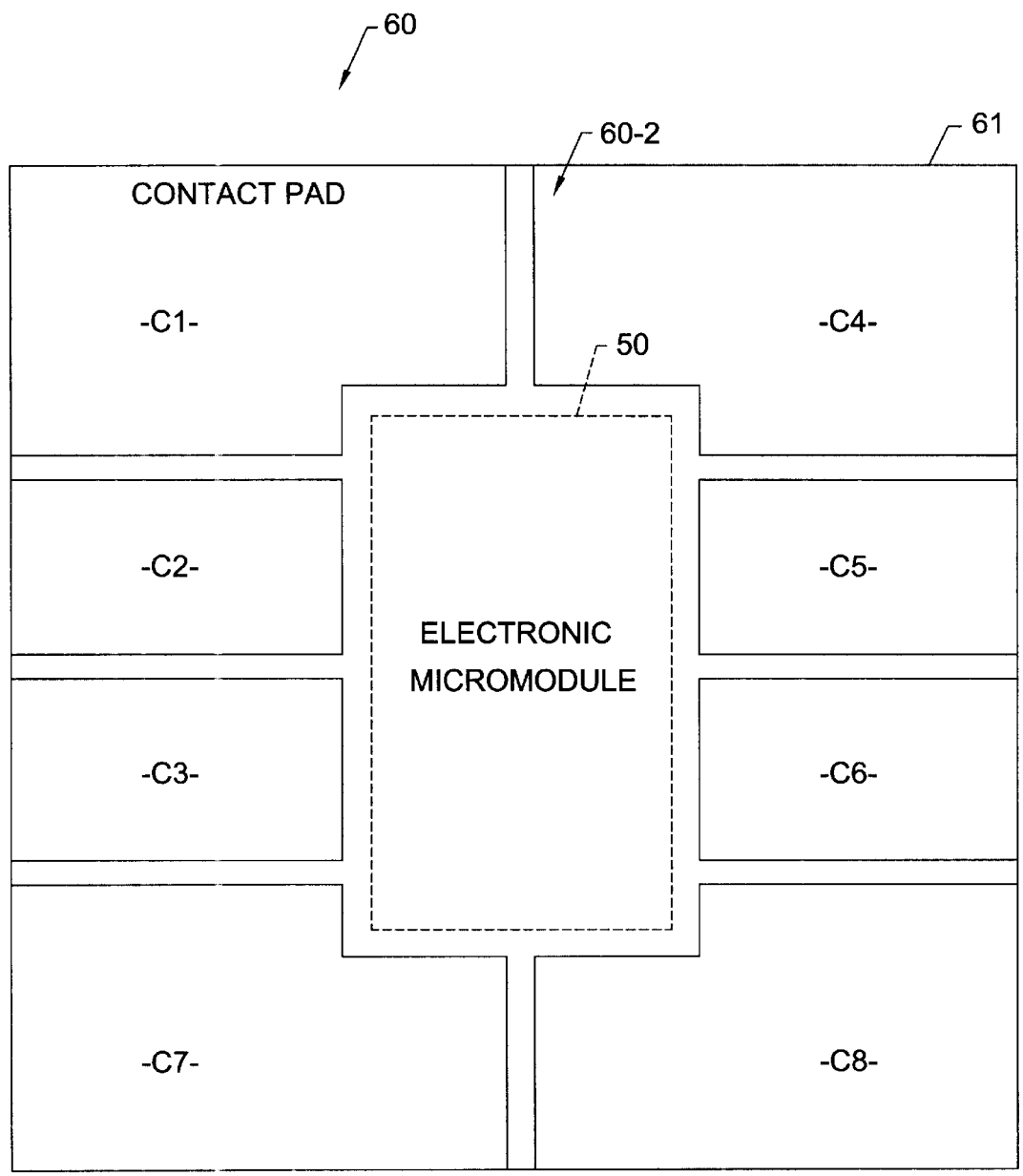

FIGS. 10A and 10B respectively show the rear side 60-1 and the front 60-2 of a hybrid micromodule 60 for a smart card with two operating modes. Micromodule 60 comprises a thin support wafer 61, such as an epoxy wafer, for example. A micromodule 50 according to the invention of the type described in relation with FIGS. 6 or 8 comprising a support wafer 2 and a coil 51 surrounding a silicon chip 52 embedded in an insulating layer 53 is stuck onto the rear side 60-1 of the wafer 61. The coil 51, produced on two first levels of insulating layer 53, is covered with a third level of the insulating layer 53 and/or by protective resin.

The silicon chip 52 is an integrated circuit with two operating modes of a well-known type, such as, for example, the one described in the European Application WO 97/49059. The chip 52 comprises two metal pads 4 connected to a coil 51 for contactless operation, and metal pads 54 for the operating mode with contact. Pads 54 are accessible via apertures 55 opening onto free air made in the insulating layer 53 and, if necessary, in the protective resin. Pads 54 are electrically connected by leads 62 made of aluminum or gold and apertures 63 made in the support wafer 61 to contact pads C1 to C6 of type ISO 7816 arranged on the front 60-2 of the hybrid micromodule (FIG. 10B). On the front 60-2, the micromodule 60 has two other pads C7 to C8 as stipulated by the above referenced standard, but are generally not used.

Thus, the integrated circuit 52 can be activated through contact pads C1 to C6 or by electromagnetic induction. The place occupied by micromodule 50 on the rear side 60-1 is represented by a dotted line in FIG. 10B. One can see that pads C1 to C8 do not cover the corresponding place on the front 60-2 so as not to form a screen for the circulation of a magnetic field in coil 51. The hybrid micromodule 60 according to the invention therefore provides good magnetic permeability and pads C1 to C8 do not considerably reduce the communication distance.

Of course, the hybrid micromodule described above can receive any type of micromodule according to the invention, such as the micromodule represented in FIG. 4 in which the coil overlaps the integrated circuit, for example. In practice, the insulating layers on which the upper conducting levels of a micromodule according to the invention lie may be simple layers of oxide so as to limit the number of manufacturing steps, or may comprise alternating layers of oxide and polyimide/oxide layers.

In general, the method according to the invention is not limited to the technological method that has just been described and may be used with any technology allowing a silicon chip to be embedded in an insulating layer, and with which a coil can be deposited on or integrated into the insulating layer.

Figure 11:
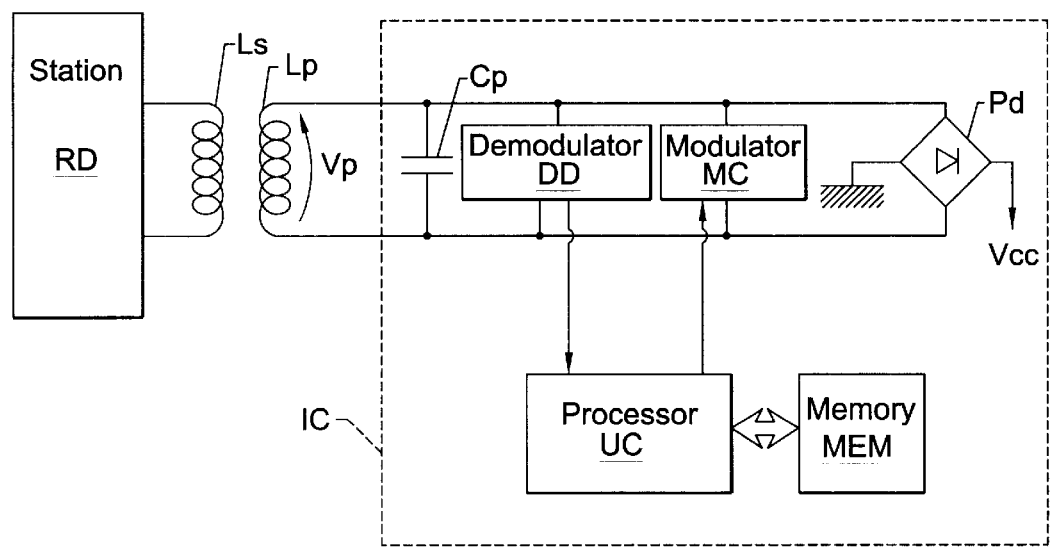
FIG. 11 is a wiring diagram in block form of a contactless integrated circuit and a data transmitting/receiving station according to the present invention.

As a reminder, FIG. 11 is a schematic representation of an example of the architecture of a contactless integrated circuit IC communicating by electromagnetic induction with a data transmitting and/or receiving station RD. The circuit IC and the station RD are each equipped with an antenna coil, respectively Lp, Ls. The circuit IC has an input capacitance Cp, a central processing unit UC with a microprocessor or hard-wired logic, a memory MEM, a diode bridge Pd, a demodulator-decoder circuit DD and a modulator-coder circuit MC. The input capacitance Cp with the coil Lp forms a resonant circuit LpCp of natural frequency Fp. The demodulator DD, the modulator MC and the diode bridge Pd are connected in parallel with the antenna circuit LpCp.

In the presence of an alternating magnetic field emitted by the coil Ls from the station RD, an induced voltage Vp appears at the terminals of the antenna circuit LpCp. This voltage Vp is adjusted by the bridge Pd to supply the circuit IC with a direct supply voltage Vcc. For the transmission of digital data to the station RD, the central processing unit UC sends the data to be transmitted to the modulator circuit MC which modulates the load of the coil Lp according to the data it receives, and according to a predetermined code.

The load modulations are passed onto the coil Ls by inductive coupling and are detected by the station Rd. The data received are extracted by a reverse demodulation and decoding operation. For the transmission of digital data to the chip IC, the station RD modulates the amplitude of the magnetic field according to the data to be transmitted, according to a predetermined code. In the chip IC, the circuit DD demodulates the voltage Vp, decodes the data received and sends the information to the central processing unit UC, which can load the information into the memory MEM.

That which is claimed is:

1. A method for making at least one electronic micromodule comprising a support wafer and an integrated circuit chip thereon, the integrated circuit chip comprising a plurality of electrical connector areas and at least one coil connected to the plurality of electrical connector areas, the method comprising:
    attaching the integrated circuit chip to the support wafer;
    forming at least one insulation layer on the support wafer and the integrated circuit chip;
    forming a plurality of openings through the at least one insulation layer to the plurality of electrical connector areas;
    forming at least one winding defining a coil on the at least one insulation layer; and
    connecting the coil to the plurality of electrical connector areas.

2. A method according to claim 1, wherein making the at least one electronic micromodule comprises making a plurality of electronic micromodules, and wherein the method further comprises cutting the support wafer to separate the plurality of electronic micromodules from one another.

3. A method according to claim 1, wherein connecting the coil to the plurality of electrical connector areas comprises depositing a conducting material in the plurality of openings.

4. A method according to claim 3, wherein the coil comprises the same conducting material deposited in the plurality of openings.

5. A method according to claim 1, wherein forming the at least one insulation layer comprises forming a first insulation layer and a second insulation layer with a conducting layer therebetween, and wherein the coil is defined on the second insulation layer.

6. A method according to claim 1, wherein the support wafer comprises silicon, and wherein forming the at least one insulation layer comprises forming a polyimide layer and forming a silicon dioxide layer on the polyimide layer.

7. A method according to claim 1, wherein forming the at least one winding to define the coil comprises:
    electroplating copper on the at least one insulation layer; and
    etching there copper to define the coil.

8. A method according to claim 1, further comprising depositing a protective material on the support wafer, the coil and the integrated circuit chip.

9. An electronic micromodule comprising:
    a support wafer;
    an integrated circuit chip on said support wafer, said integrated circuit chip comprising a plurality of electrical connector areas;
    at least one insulation layer on said support wafer and said integrated circuit chip, said at least one insulation layer including a plurality of openings to said plurality of electrical connector areas; and
    at least one winding defining a coil on said at least one insulation layer and being connected to said plurality of electrical connector areas.

10. An electronic micromodule according to claim 9, further comprising a conducting material in each of the plurality of openings through said at least one insulation layer, wherein said conducting material connects said coil to said plurality of electrical connector areas.

11. An electronic micromodule according to claim 9, wherein said at least one insulation layer comprises a first insulation layer and a second insulation layer with a conductor therebetween for connecting said coil to said plurality of electrical connector areas.

12. An electronic micromodule according to claim 9, wherein said at least one insulation layer comprises a first insulation layer and a second insulation layer, and wherein said at least one winding defining the coil comprises a first winding defining a first coil on said first insulation layer and a second winding defining a second coil on said second insulation layer.

13. An electronic micromodule according to claim 9, wherein said support wafer comprises silicon and said at least one insulation layer comprises a polyimide layer and a silicon dioxide layer on said polyimide layer.

14. A hybrid electronic micromodule comprising:
    a support wafer comprising a plurality of contact pads on a front side thereof;
    an electronic micromodule on a rear side of said support wafer and comprising
        an integrated circuit chip comprising a plurality of electrical connector areas,
        at least one insulation layer on the rear side of said support wafer and said integrated circuit chip, said at least one insulation layer including a plurality of first openings to said plurality of electrical connector areas and a plurality of second openings to said plurality of contact pads, and at least one winding defining a coil on said at least one insulation layer and being connected to said plurality of electrical connector areas via said plurality of first opening, said electronic micromodule having a contact operating mode via said plurality of contact pads, and a contactless operating mode via said coil.

15. A hybrid electronic micromodule according to claim 14, further comprising a conducting material in each of the plurality of first and second openings through said at least one insulation layer, and wherein said conducting material connects said coil to said plurality of electrical connector areas.

16. A hybrid electronic micromodule according to claim 14, wherein said at least one insulation layer comprises a first insulation layer and a second insulation layer with a conductor therebetween for connecting said coil to said plurality of electrical connector areas.

17. A hybrid electronic micromodule according to claim 14, wherein said at least one insulation layer comprises a first insulation layer and a second insulation layer, and wherein said at least one winding defining the coil comprises a first winding defining a first coil on said first insulation layer and a second winding defining a second coil on said second insulation layer.

18. A hybrid electronic micromodule according to claim 17, wherein said support wafer comprises silicon and said at least one insulation layer comprises a polyimide layer and a silicon dioxide layer on the polyimide layer.

19. A contactless integrated circuit comprising:
an electronic micromodule comprising
a support wafer;
an integrated circuit chip on said support wafer, said integrated circuit chip comprising a plurality of electrical connector areas;
at least one insulation layer on said support wafer and said integrated circuit chip, said at least one insulation layer including a plurality of openings to said plurality of electrical connector areas; and
at least one winding defining an antenna circuit on said at least one insulation layer and being connected to said plurality of electrical connector areas;
a demodulator connected to said antenna circuit for reception of digital data;
a modulator connected to said antenna circuit for transmission of the digital data; and
a processor connected to said demodulator and to said modulator.

20. A contactless integrated circuit according to claim 19, wherein said demodulator and said modulator are connected in parallel to said antenna circuit.

21. A contactless integrated circuit according to claim 19, further comprising a memory connected to said processor.

22. A contactless integrated circuit according to claim 19, further comprising a diode bridge connected in parallel to said antenna circuit for adjusting a voltage being applied to said electronic micromodule.

23. A contactless integrated circuit according to claim 19, further comprising a conducting material in each of the plurality of openings through said at least one insulation layer, wherein said conducting material connects said antenna circuit to said plurality of electrical connector areas.

24. A contactless integrated circuit according to claim 19, wherein said at least one insulation layer comprises a first insulation layer and a second insulation layer with a conductor therebetween for connecting said antenna circuit to said plurality of electrical connector areas.

25. A contactless integrated circuit according to claim 19, wherein said at least one insulation layer comprises a first insulation layer and a second insulation layer, and wherein said at least one winding defining an antenna circuit comprises a first winding defining a first antenna circuit on said first insulation layer and a second winding defining a second antenna circuit on said second insulation layer.

26. A contactless integrated circuit according to claim 19, wherein said support wafer comprises silicon and said at least one insulation layer comprises a polyimide layer and a silicon dioxide layer on said polyimide layer.

* * * * *